US012757323B2

(12) United States Patent
Ting et al.

(10) Patent No.: US 12,757,323 B2
(45) Date of Patent: Oct. 6, 2026

(54) ELECTRONIC DEVICE AND MANUFACTURING METHOD THEREOF

(71) Applicant: Innolux Corporation, Miaoli County (TW)

(72) Inventors: Chin-Lung Ting, Miaoli County (TW); Kuang-Ming Fan, Miaoli County (TW); Yi-Liang Chen, Miaoli County (TW); Lung-Shu Huang, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 229 days.

(21) Appl. No.: 18/793,961

(22) Filed: Aug. 5, 2024

(65) Prior Publication Data

US 2025/0081333 A1 Mar. 6, 2025

Related U.S. Application Data

(60) Provisional application No. 63/536,712, filed on Sep. 6, 2023.

(30) Foreign Application Priority Data

May 28, 2024 (CN) ......................... 202410673634.7

(51) Int. Cl.
*H05K 1/02* (2006.01)
*H05K 3/28* (2006.01)
*H05K 3/40* (2006.01)

(52) U.S. Cl.
CPC ........... *H05K 1/0296* (2013.01); *H05K 3/282* (2013.01)

(58) Field of Classification Search
CPC ..... H05K 1/0296; H05K 3/282; H05K 3/4007
See application file for complete search history.

(56) References Cited

U.S. PATENT DOCUMENTS

| | | | | |
|---|---|---|---|---|
| 11,049,799 | B1 * | 6/2021 | Lin | H10D 30/475 |
| 2021/0151382 | A1 | 5/2021 | Hu | |
| 2021/0202412 | A1 * | 7/2021 | Shih | H10W 70/611 |

FOREIGN PATENT DOCUMENTS

| | | |
|---|---|---|
| TW | I351730 | 11/2011 |

* cited by examiner

*Primary Examiner* — Sherman Ng
(74) *Attorney, Agent, or Firm* — JCIPRNET

(57) ABSTRACT

Disclosed are an electronic device and a manufacturing method thereof. The electronic device includes a circuit structure and at least one contacting part. The at least one contacting part is disposed on the circuit structure, and includes an insulating part and a conductive layer. The conductive layer surrounds the insulating part, and the conductive layer is electrically connected to the circuit structure. The electronic device disclosed herein may have a buffering effect or reduce damage to an object to be detected.

18 Claims, 9 Drawing Sheets

ELECTRONIC DEVICE AND MANUFACTURING METHOD THEREOF

CROSS-REFERENCE TO RELATED APPLICATION

This application claims the priority benefits of U.S. provisional application Ser. No. 63/536,712, filed on Sep. 6, 2023 and China application serial no. 202410673634.7, filed on May 28, 2024. The entirety of each of the above-mentioned patent applications is hereby incorporated by reference herein and made a part of this specification.

BACKGROUND

Technical Field

The disclosure relates to an electronic device and a manufacturing method thereof, and in particular to an electronic device having a buffering effect or increasing service life and a manufacturing method thereof.

Description of Related Art

Electronic devices or splicing electronic devices have been widely used in different fields such as communication, display, automotive, or aviation. With the rapid development of electronic devices, electronic devices are being developed towards being lighter and thinner, so the reliability or quality demands for electronic devices are higher.

SUMMARY

The disclosure provides an electronic device and a manufacturing method thereof, which can have a buffering effect (for example, reducing damage or scratches on an object to be detected) or can increase the service life (for example, slowing down the aging of a circuit structure).

According to an embodiment of the disclosure, an electronic device includes a circuit structure and at least one contacting part. The at least one contacting part is disposed on the circuit structure, and includes an insulating part and a conductive layer. The conductive layer surrounds the insulating part, and is electrically connected to the circuit structure.

According to an embodiment of the disclosure, a manufacturing method of an electronic device includes the following steps. A circuit structure is provided. At least one contacting part is formed on the circuit structure. The at least one contacting part includes an insulating part and a conductive layer, and the conductive layer surrounds the insulating part, and is electrically connected to the circuit structure.

According to an embodiment of the disclosure, a manufacturing method of an electronic device has a first operation mode, and includes the following steps. A carrier board is provided. A circuit structure is coupled to the carrier board. At least one contacting part is formed on the circuit structure. An object to be detected is provided, so that the at least one contacting part is electrically connected to the object to be detected in the first operation mode. The at least one contacting part includes an insulating part and a conductive layer, and the conductive layer surrounds the insulating part, and is electrically connected to the circuit structure.

BRIEF DESCRIPTION OF THE DRAWINGS

The accompanying drawings are included to provide a further understanding of the disclosure, and are incorporated in and constitute a part of this specification. The drawings illustrate the embodiments of the disclosure and, together with the description, serve to explain the principles of the disclosure.

DESCRIPTION OF THE EMBODIMENTS

Figure 1:
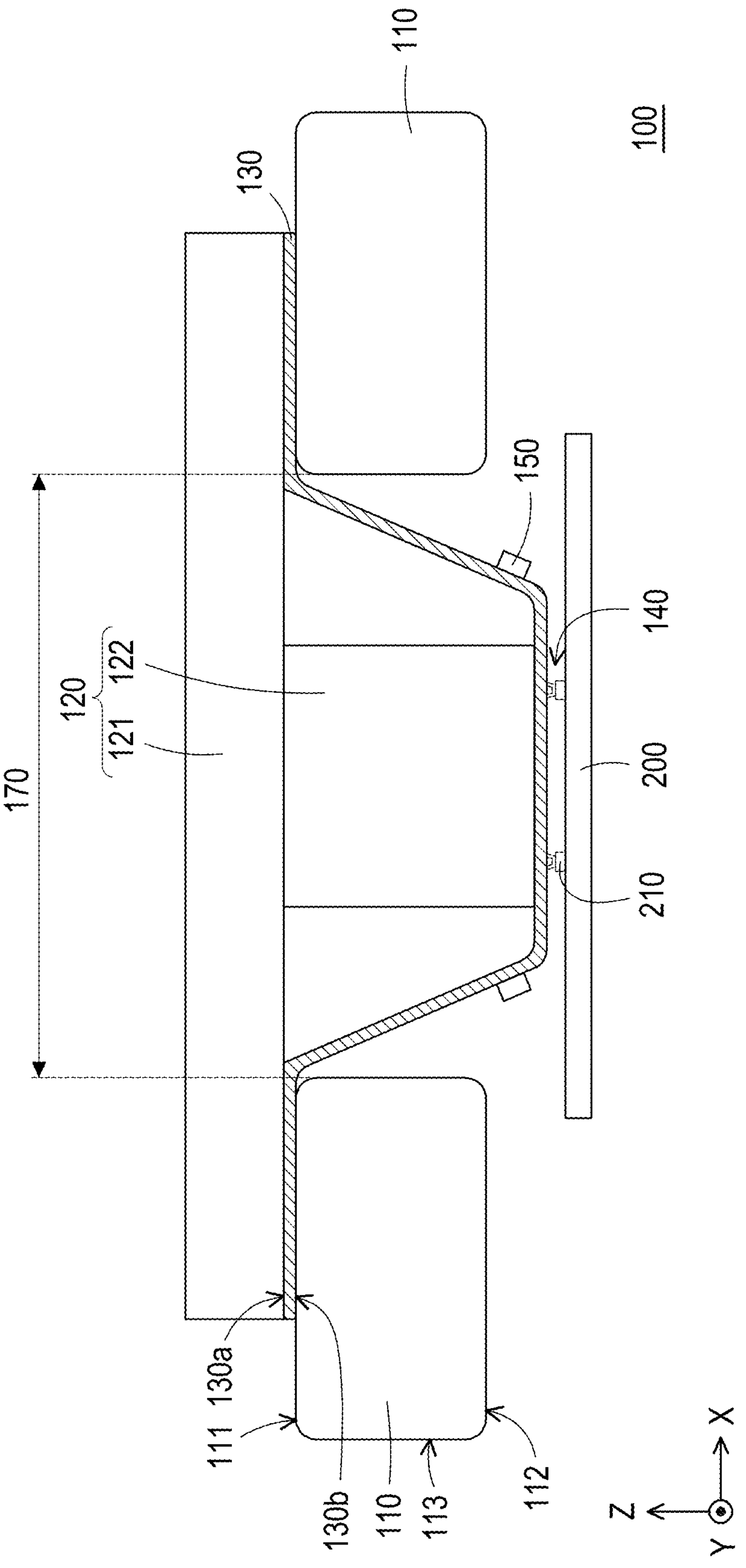
FIG. 1 is a schematic cross-sectional view of an electronic device according to a first embodiment of the disclosure.

The disclosure may be understood by referring to the following detailed description with reference to the accompanying drawings. It should be noted that for comprehension of the reader and simplicity of the drawings, in the drawings provided in the disclosure, only a part of the electronic device is shown, and certain devices in the drawings are not necessarily drawn to actual scale. Moreover, the quantity and the size of each device in the drawings are only schematic and exemplary and are not intended to limit the scope of protection provided in the disclosure.

In the following description and claims, the words "including" and "comprising" are open-ended words, and thus should be interpreted as meaning "including but not limited to . . . ".

It should be understood that when an element or a film layer is referred to as being "on" or "connected" to another element, it may be directly on or connected to the other element, or there may be intervening elements and film layers (indirect case) between the two. In contrast, when an element is referred to as being "directly on" or "directly connected to" another element, there are no intervening elements or film layers between the two.

Although the terms "first", "second", "third" . . . may be used to describe various constituent elements, the constituent elements are not limited by such terms. This term is only used to distinguish a single element from other elements in the specification. The same terms may not be used in the claims, but replaced by first, second, third . . . in the order in which the elements are mentioned in the claims. Therefore, in the following description, the first constituent element may be the second constituent element in the claims.

As used herein, the terms "about," "approximately," "substantially," and "roughly" generally mean within 10%, 5%, 3%, 2%, 1%, or 0.5% of the given value or range. The numbers given here are approximate numbers, that is, without specific explanation of "about", "approximately", "substantially", or "roughly", the meanings of "about", "approximately", "substantially", or "roughly" may still be implied.

In some embodiments of the disclosure, terms related to joining and connecting, such as "connected", "interconnected", etc., unless otherwise defined, may mean that the two structures are in direct contact, or may also mean that the two structures are not in direct contact, and there are other structures located between these two structures. And the terms regarding joining and connecting may also refer to the circumstances where both structures are movable, or both structures are fixed. Furthermore, the term "coupled" refers to any direct and indirect electrical connection.

In some embodiments of the disclosure, measurement of area, width, thickness, height of each element, or measurement of distance or pitch between elements may be done by using an optical microscopy (OM), a scanning electron microscope (SEM), an alpha step ($\alpha$-step) profilometer, an ellipsometer, or other appropriate methods. Specifically, according to some embodiments, the SEM may be used to obtain a cross-sectional structure image of a to-be-measured element, and the area, the width, the thickness, or the height of each element, or the distance or the pitch between elements may be measured.

An electronic device or an electronic assembly of the disclosure may include a display device, an antenna device, a sensing device, or a splicing device, but the disclosure is not limited thereto. The electronic device may be a bendable or flexible electronic device. The electronic device may include, for example, liquid crystal and light emitting diode (LED). The LED may include, for example, an organic light emitting diode (OLED), a sub-millimeter light emitting diode (mini LED), a micro light emitting diode (micro LED), a quantum dot (QD) light emitting diode (which may be, for example, QLED and QDLED), fluorescence, phosphor, or any other appropriate materials, and the materials may be arranged and combined in any manner, but the disclosure is not limited thereto. The antenna device may be, for example, a liquid crystal antenna, but the disclosure is not limited thereto. The splicing device may be, for example, a display splicing device or an antenna splicing device, but the disclosure is not limited thereto. It should be noted that the electronic device may be any arrangement or a combination of the foregoing, but the disclosure is not limited thereto. The disclosure is described below with an example of the electronic device, which should however not be construed as a limitation in the disclosure. According to an embodiment of the disclosure, an electronic unit may include a packaging element. The packaging element may include a system on package (SoC), a system in package (SiP), an antenna in package (AiP), a co-packaged optics (COP), a micro electro mechanical system (MEMS), a high density interconnector PCB (HDI PCB), an IC carrier board, or a combination thereof, but the disclosure is not limited thereto. It should be noted that the following embodiments may be implemented by replacing, reorganizing, or mixing features of several different embodiments without departing from the spirit of the disclosure to implement other embodiments. The features of the various embodiments may be mixed and matched as desired as long as they do not violate the spirit of the invention or conflict with each other.

Reference is now be made in detail to exemplary embodiments of the disclosure, and examples of the exemplary embodiments are illustrated in the accompanying drawings. Whenever possible, the same reference numerals are used in the drawings and descriptions to indicate the same or similar parts.

Figure 2A:
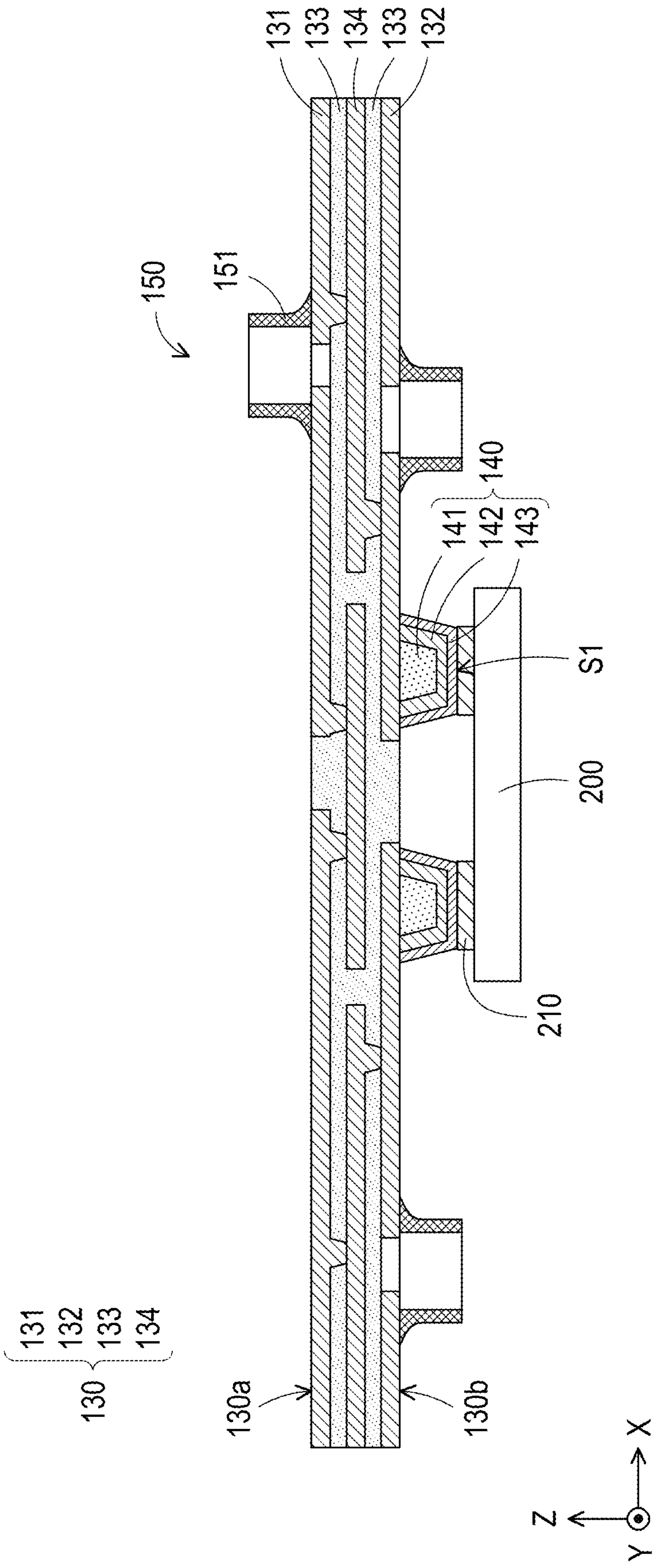
FIG. 2A is a schematic partial enlarged view of the electronic device in FIG. 1.
Figure 2B:
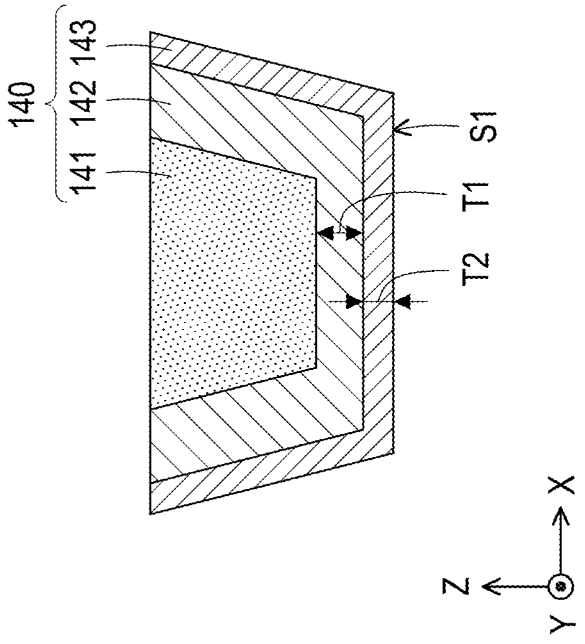
FIG. 2B is a schematic partial enlarged view of a contacting part in FIG. 2A.
Figure 2C:
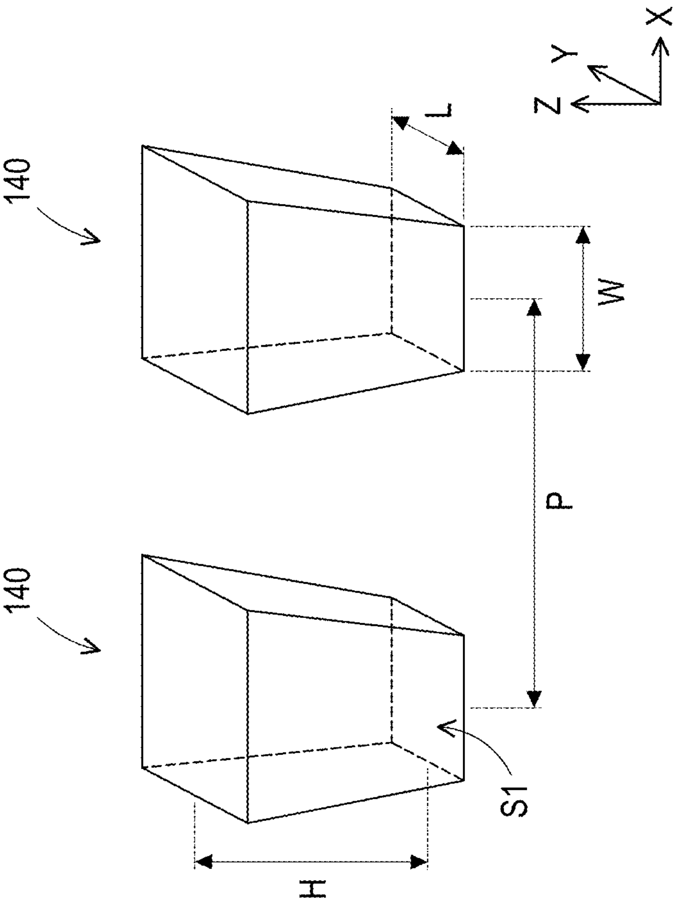
FIG. 2C is a schematic three-dimensional view of the contacting part in FIG. 2A.

FIG. 1 is a schematic cross-sectional view of an electronic device according to a first embodiment of the disclosure. FIG. 2A is a schematic partial enlarged view of the electronic device in FIG. 1. FIG. 2B is a schematic partial enlarged view of a contacting part in FIG. 2A. FIG. 2C is a schematic three-dimensional view of the contacting part in FIG. 2A. FIG. 3A to FIG. 3F are schematic partial cross-sectional views of a manufacturing method of the electronic device in FIG. 2A.

Referring to FIG. 1 and FIG. 2A together, an electronic device 100 of this embodiment includes a circuit board 110, a carrier board 120, a circuit structure 130, at least one contacting part 140, and a surface element 150. The electronic device 100 may be electrically connected to an object to be detected 200 by the contacting part 140. For example, the electronic device 100 has a first operation mode, and the first operation mode may be used to perform an electrical test on the object to be detected 200 by the contacting part 140. In this embodiment, the object to be detected 200 may include a semiconductor wafer, a display device, other electronic devices, or electronic units that require the electrical test, but the disclosure is not limited thereto. The electronic device 100 may further include a through groove 170, and the through groove 170 may separate the circuit board 110. That is, when the electronic device 100 has multiple circuit boards 110, the through groove 170 may be disposed between two adjacent circuit boards 110. The appropriate width of the through groove 170 may prevent signals of the circuit boards 110 from interfering with each other in the first operation mode. For example, in an X direction, the maximum width of the through groove 170 may be greater than or equal to 1/10 of the maximum width of the circuit board 110 and less than or equal to ½ of the maximum width of the circuit board 110. If the widths of the two adjacent circuit boards 110 are different, the one with the larger width is used as a target, but the disclosure is not limited thereto. The through groove 170 may be aligned with the object to be detected 200, and may overlap with the object to be detected 200 in a Z direction (a normal direction of the circuit board 110, a normal direction of the carrier board 120, or a normal direction of the electronic device 100).

Specifically, the circuit board 110 may be electrically connected to a testing machine (not shown) and the circuit structure 130 respectively. The circuit board 110 may be electrically connected to the contacting part 140 by the circuit structure 130. When the electronic device 100 performs the electrical test on the object to be detected 200, the circuit board 110 or the circuit structure 130 may be used to transmit electrical signals between the testing machine and the object to be detected 200, and may be, for example, an HDI board, an IC carrier board, a combination thereof, or other circuit structures. In this embodiment, the circuit board 110 has an upper surface 111, a lower surface 112, and a side surface 113. The side surface 113 is respectively connected to the upper surface 111 and the lower surface 112, and a connecting portion has an arc-shaped profile. This design may reduce the risk of the circuit structure 130 being broken, but the disclosure is not limited thereto. The upper surface 111 and the lower surface 112 are opposite to each other and in the first operation mode. The upper surface 111 is farther away from the object to be detected 200 than the lower surface 112. The circuit board 110 may be, for example, a PCB board or other suitable connectors.

The carrier board 120 is disposed on the upper surface 111 of the circuit board 110. The carrier board 120 may be any element used to support the circuit structure 130. The carrier board 120 may include a steel plate, glass, polyimide (PI), polyethylene terephthalate (PET), a wafer, an ajinomoto build-up film (ABF) layers, a bismaleimide triazine (BT)

resin carrier board, a flame resistant glass fiber (FR4) substrate, other appropriate materials, or a combination thereof, but the disclosure is not limited thereto. In this embodiment, the carrier board 120 may include a body 121 and a buffer 122. The body 121 is disposed on the upper surface 111 of the circuit board 110. The buffer 122 is disposed on the body 121. The buffer 122 is disposed in the through groove 170. The buffer 122 is disposed between the body 121 and the circuit structure 130 in the Z direction, thereby supporting the circuit structure 130. The elongation of the buffer 122 may be 80% to 150%, but the disclosure is not limited thereto. Further, the elongation of the buffer 122 may be greater than or equal to the elongation of the body 121. When the electronic device 100 performs the electrical test on the object to be detected 200 (or in the first operation mode), the buffer 122 of the carrier board 120 may press down the circuit structure 130, so that the contacting part 140 may contact and may be electrically connected to a conductive pad 210 of the object to be detected 200. Through the above design, since the carrier board 120 may provide a supporting or buffering effect, the damage to the object to be detected 200 may be reduced or the aging of the circuit structure 130 may be slowed down.

The circuit structure 130 is disposed on the upper surface 111 of the circuit board 110, and at least a part of the circuit structure 130 is disposed between the carrier board 120 and the upper surface 111 of the circuit board 110. The circuit structure 130 is coupled to the carrier board 120. For example, the circuit structure 130 may be electrically connected to or fixed to the carrier board 120. In this embodiment, the circuit structure 130 may be, for example, a redistribution structure/layer (RDL), but the disclosure is not limited thereto. The circuit structure 130 has a first surface 130*a* and a second surface 130*b* opposite to each other, and the first surface 130 faces the carrier board 120. The circuit structure 130 includes a first conductive layer 131, a second conductive layer 132, a third conductive layer 133, and an insulating layer 134. The first conductive layer 131 is disposed on the first surface 130*a*. The second conductive layer 132 is disposed on the second surface 130*b*. The insulating layer 134 is disposed between the first conductive layer 131 and the second conductive layer 132. The third conductive layer 133 is disposed between the first conductive layer 131 and the second conductive layer 132, and is disposed in the insulating layer 134. In this embodiment, materials of the first conductive layer 131, the second conductive layer 132, and the third conductive layer 133 may include metal materials, transparent conductive materials, other appropriate conductive materials, or a combination thereof, but the disclosure is not limited thereto. In this embodiment, the insulating layer 134 may be a single-layer structure or a multi-layer structure, and a material of the insulating layer 134 may include polyimide (PI), glass, epoxy, silane coupling, photosensitive materials, build-up layer materials, or a combination thereof, but the disclosure is not limited thereto. According to some embodiments, the RDL may redistribute the traces of the object to be detected or the electronic element and/or further increase the circuit fan area, or different electronic elements may be electrically connected to each other by the circuit structure 130. For example, the pitch between two adjacent contact pads of the circuit structure 130 near one terminal of the object to be detected 200 may be less than or equal to the pitch between the two adjacent contact pads of the circuit structure 130 near one terminal of the carrier board 120, so the circuit structure 130 may adjust the circuit distribution, but the disclosure is not limited thereto. Further, the circuit structure 130 may be applied to a wafer level chip scale package (WLCSP), a wafer level package (WLP), a panel level package (PLP), or other packaging methods, but the disclosure is not limited thereto.

Referring to FIG. 1, FIG. 2A, and FIG. 2B together, the contacting part 140 is disposed on the second surface 130*b* of the circuit structure 130. The contacting part 140 may contact and may be electrically connected to the second conductive layer 132 of the circuit structure 130. In this embodiment, the contacting part 140 includes an insulating part 141, a conductive layer 142, and an anti-oxidation layer 143. The conductive layer 142 surrounds the insulating part 141, and may be electrically connected to the circuit structure 130. The anti-oxidation layer 143 surrounds the conductive layer 142 to reduce the probability of the conductive layer 142 being oxidized by contacting with external water and oxygen. According to some embodiments, the contacting part 140 may be a conductive pad for contacting the object to be detected when performing the first operation mode. For example, when detecting a wafer (object to be detected), the contacting part 140 may be an input/output pad (I/O pad) for contacting the wafer.

In this embodiment, the material of the insulating part 141 may be polymer, polyimide, photosensitive polyimide, silicone rubber, resin, other organic materials with elasticity (high elongation) or a buffering effect, or a combination thereof, but the disclosure is not limited thereto. According to some embodiments, the elongation of the insulating part 141 is greater than the elongation of the insulating layer of the circuit structure 130. The conductive layer 142 may be a single-layer structure or a multi-layer structure, and the material of the conductive layer 142 may include copper, titanium, aluminum, nickel, silver, gold, tantalum, platinum, or a combination thereof, but the disclosure is not limited thereto. An anti-oxidation layer 143 may be a single-layer structure or a multi-layer structure, and the material of the anti-oxidation layer 143 may include nickel, palladium, gold, alloys thereof (for example, electroless nickel immersion gold (ENIG)), or a combination thereof, but the disclosure is not limited thereto. The reactivity of the anti-oxidation layer 143 may be lower than the reactivity of the conductive layer 142 to reduce the probability of the conductive layer 142 being oxidized by contacting with external water and oxygen.

In this embodiment, the elongation of the insulating part 141 may be 20% to 900%, and the elongation of the insulating part 141 may be greater than the elongation of the insulating layer 134 of the circuit structure 130, so as to increase the toughness and deformation of the contacting part 140 containing the insulating part 141, and enable the contacting part 140 including the insulating part 141 to provide a buffering effect to reduce damage to the object to be detected 200 or slow down the aging of the circuit structure 130, but the disclosure is not limited thereto.

In this embodiment, the conductive layer 142 has a thickness T1, and the anti-oxidation layer 143 has a thickness T2. The thickness T1 is, for example, the maximum thickness of the conductive layer 142 measured along the Z direction, and the thickness T2 is, for example, the maximum thickness of the anti-oxidation layer 143 measured along the Z direction. In this embodiment, the thickness T2 of the anti-oxidation layer 143 may be less than the thickness T1 of the conductive layer 142, but the disclosure is not limited thereto.

Referring to FIG. 2C, in the three-dimensional view of the contacting part 140, a bottom surface S1 of the contacting part 140 facing the object to be detected 200 has a length L and a width W, the contacting part 140 has a height H, and a pitch P is provided between the two adjacent contacting parts 140. The length L is, for example, the maximum length of the bottom surface S1 of the contacting part 140 measured along a Y direction, the width W is, for example, the maximum width of the bottom surface S1 of the contacting part 140 measured along the X direction, the height H is, for example, the maximum height of the contacting part 140 measured along the Z direction, and the pitch P is, for example, the distance between the centers of the bottom surfaces S1 of the two adjacent contacting parts 140 measured along the X direction. In this embodiment, the length L of the contacting part 140 may be 5 μm to 200 μm, and the width W may be 5 μm to 200 μm, so that the bottom surface S1 of the contacting part 140 may have enough contact area to contact the conductive pad 210 of the object to be detected 200, thereby reducing the contact resistance, but the disclosure is not limited thereto. According to some embodiments, the length L of the contacting part 140 is less than or equal to the length of the conductive pad 210 of the object to be detected 200, or a ratio of the length L of the contacting part 140 to the length of the conductive pad 210 is greater than or equal to 0.5 and less than 1. This design allows the bottom surface S1 of the contacting part 140 to have a sufficient contact area to contact the conductive pad 210 of the object to be detected 200. In this embodiment, the height H of the contacting part 140 may be 30 μm to 200 μm, and the ratio of the length L of the contacting part 140 to the height H may be greater than or equal to 0.5 and less than or equal to 1.5 (that is, $0.5 \leq L/H \leq 1.5$), so that when the contacting part 140 collapses due to pressing down the conductive pad 210 contacting the object to be detected 200, there may be sufficient buffer space to slow down the aging of the circuit structure 130, but the disclosure is not limited thereto. In this embodiment, the pitch P between the two adjacent contacting parts 140 may be 10 μm to 500 μm, so that the two adjacent contacting parts 140 may both contact the two adjacent conductive pads 210 on the object to be detected 200 during the electrical test, but the disclosure is not limited thereto.

Please continue to refer to FIG. 2C. In this embodiment, the contacting part 140 may have a column shape, but the disclosure is not limited thereto. In some embodiments, the contacting part may also have a sphere shape or any other shape.

In this embodiment, the maximum coplanarity of the circuit structure 130 may be 10% to 20% of the height H of the contacting part 140 to reduce an error of the electrical test. That is, when the circuit structure 130 coupled to the carrier board 120 is pressed down to contact the object to be detected 200, the average height difference between each contacting part 140 should be greater than or equal to 0 and less than or equal to 0.2 times the height H, or greater than or equal to 0.1 times the height H and less than or equal to 0.2 times the height H. In this way, errors of the electrical test can be avoided. The coplanarity referred to in the disclosure means that the property or state that multiple points exist on the same plane. That is, it is preferred to have the smaller the average pitch or the average height difference between multiple contacting parts 140 or at least ten or more contacting parts 140 of the circuit structure 130 and the same plane or a straight line. When the average pitch or the average height difference is at least less than and equal to 0.2 times the height H, an improved the test quality can be obtained. The pitch or the height difference is measured in a direction perpendicular to the plane or the line, and the plane may be considered as a plane or a line parallel to the carrier board 120. For example, the line may extend along the X direction on the view.

In this embodiment, the X direction, the Y direction, and the Z direction are different directions. For example, the X direction is an extended direction of the width W of the bottom surface S1 of contacting part 140, the Y direction is an extended direction of the length L of the bottom surface S1 of contacting part 140, and the Z direction is a normal direction of the circuit board 110 or a normal direction of the electronic device 100. The X direction and the Y direction are respectively substantially perpendicular to the Z direction, and the X direction is substantially perpendicular to the Y direction, but the disclosure is not limited thereto.

Please continue to refer to FIG. 1 and FIG. 2A together. The surface element 150 is disposed on the circuit structure 130. The surface element 150 may be bonded and electrically connected to the circuit structure 130 by a bonding element 151. In this embodiment, the surface element 150 may be a passive element (such as a capacitor, a resistor, or an inductor) or other electronic elements, but the disclosure is not limited thereto. In this embodiment, the bonding element 151 may be a solder, an anisotropic conductive film (ACF), or other conductive elements, but the disclosure is not limited thereto. A material of the bonding element 151 may be tin, but the disclosure is not limited thereto.

The object to be detected 200 is placed under the circuit board 110. The object to be detected 200 may overlap with the through groove 170 in the Z direction. The object to be detected 200 has the conductive pad 210. The object to be detected 200 may contact and may be electrically connected to the contacting part 140 by the conductive pad 210.

Next, referring to FIG. 3A to FIG. 3F, the manufacturing method of the contacting part 140 of the electronic device 100 is described below according to the embodiment of the disclosure. In this embodiment, the manufacturing method of the contacting part 140 of the electronic device 100 may include but is not limited to the following steps.

Figure 3B:
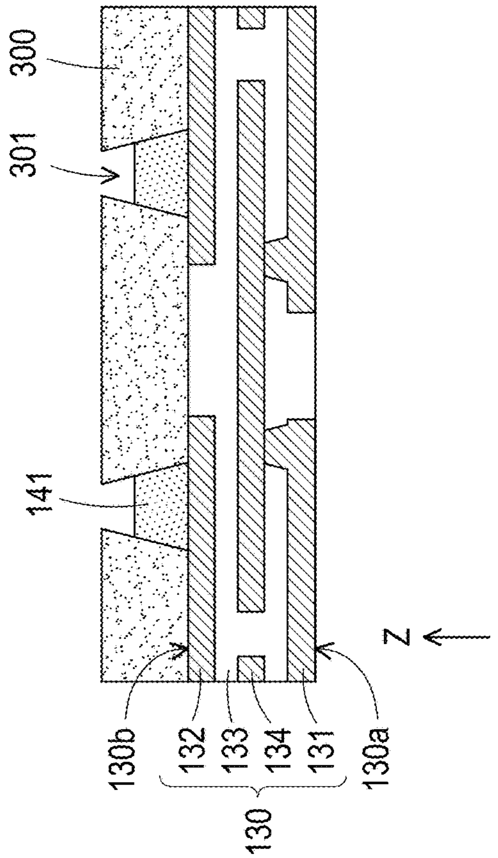
FIG. 3A to FIG. 3F are schematic partial cross-sectional views of a manufacturing method of the electronic device in FIG. 2A.
Figure 3A:
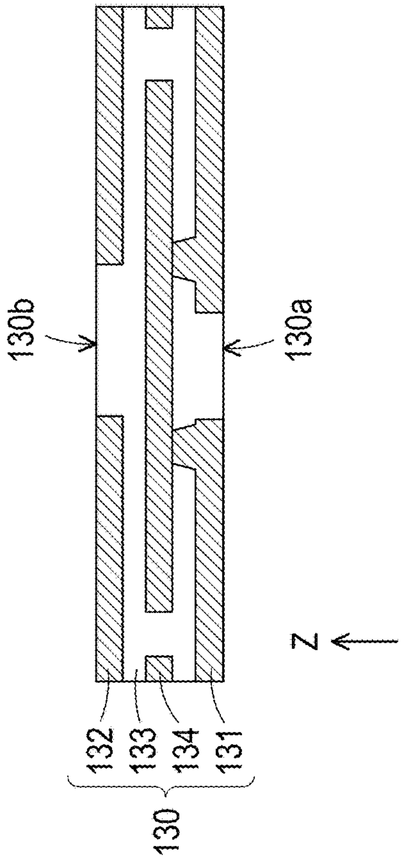

First, referring to FIG. 3A, the circuit structure 130 is provided. Specifically, the circuit structure 130 has the first surface 130*a* and the second surface 130*b* opposite to each other. The circuit structure 130 includes the first conductive layer 131, the second conductive layer 132, the third conductive layer 133, and the insulating layer 134. The first conductive layer 131 is disposed in the first surface 130*a*. The second conductive layer 132 is disposed in the second surface 130*b*. The insulating layer 134 is disposed between the first conductive layer 131 and the second conductive layer 132. The third conductive layer 133 is disposed between the first conductive layer 131 and the second conductive layer 132, and is disposed in the insulating layer 134.

Next, referring to FIG. 3B, a first photoresist 300 is formed on the second surface 130*b* of the circuit structure 130, and the insulating part 141 is formed in a first opening 301 of the first photoresist 300. Specifically, the first photoresist 300 has the first opening 301, and the first opening 301 may expose the portion of the circuit structure 130. The insulating part 141 is filled into the first opening 301 of the first photoresist 300, so that the insulating part 141 may contact the second surface 130*b* of the portion of the circuit structure 130 exposed by the first opening 301.

Figure 3D:
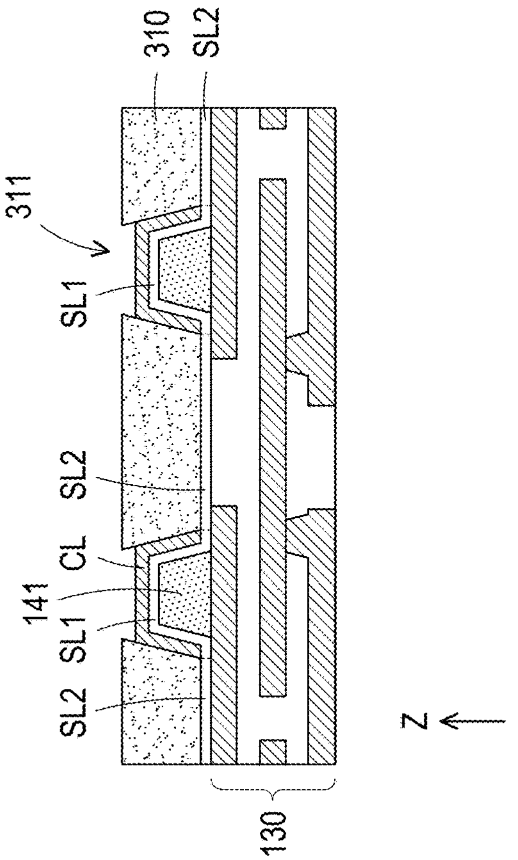
Figure 3C:
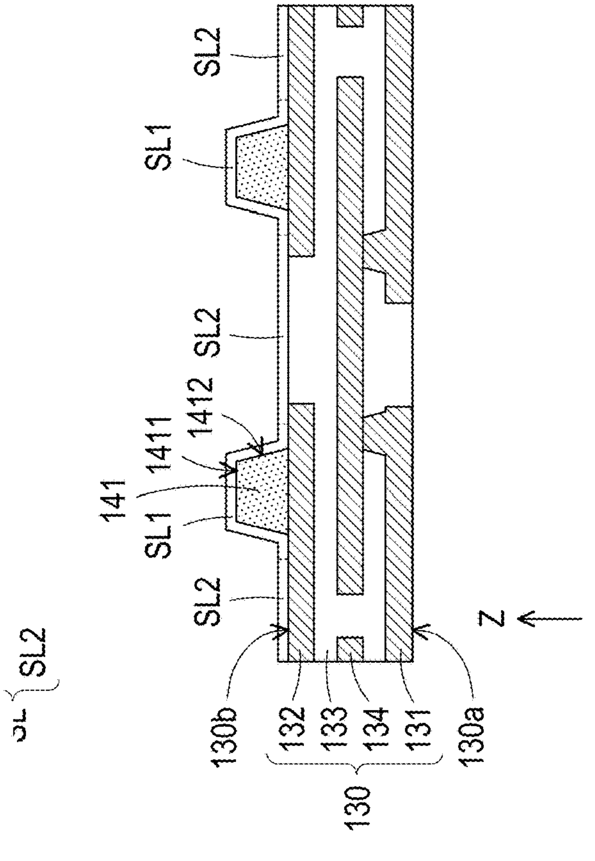

Next, referring to FIG. 3C, the first photoresist 300 is removed, and a seed layer SL is formed on the insulating part 141. Specifically, the seed layer SL includes a first portion SL1 and a second portion SL2 connected to each other. The first portion SL1 of the seed layer SL may contact and cover an upper surface 1411 (that is, the surface facing away from the circuit structure 130) and a side surface 1412 of the insulating part 141, and the second portion SL2 of the seed layer SL may contact and cover the second surface 130*b* of the portion of the circuit structure 130. In this embodiment, the seed layer SL is formed by, for example, atomic layer deposition (ALD), chemical vapor deposition (CVD), electroplating, chemical plating, or physical vapor deposition (PVD), but the disclosure is not limited thereto. The seed layer SL may include a conductive material, such as titanium, copper, tantalum, tungsten, alloys of the foregoing, and a combination thereof, or other appropriate conductive materials. In the Z direction, a thickness of the seed layer SL is greater than or equal to 0.2 μm and less than or equal to 3 μm, thereby improving the bonding ability between the contacting part 140 and other film layers, but the disclosure is not limited thereto. According to some embodiments, the seed layer SL may include a single layer conductive material or a multi-layer conductive material stack.

Next, referring to FIG. 3D, a second photoresist 310 is formed on the seed layer SL, and the conductive material layer CL is formed in a second opening 311 of the second photoresist 310. Specifically, the second photoresist 310 has the second opening 311. The second opening 311 may expose the first portion SL1 of the seed layer SL, and the second photoresist 310 may cover the second portion SL2 of the seed layer SL. The conductive material layer CL may contact the first portion SL1 of the seed layer SL. In this embodiment, the conductive material layer CL is formed by, for example, electroplating or chemical plating, but the disclosure is not limited thereto. The conductive material layer CL may include the conductive material, such as titanium, copper, tantalum, tungsten, alloys of the foregoing, and a combination thereof, or other appropriate conductive materials. In the Z direction, the thickness of the conductive material layer CL is greater than or equal to 2 μm and less than or equal to 7 μm, thereby reducing the resistance and avoiding signal loss, but the disclosure is not limited thereto. According to some embodiments, the reactivity of the conductive material layer CL is less than or equal to the reactivity of at least one of the seed layers SL.

Figure 3F:
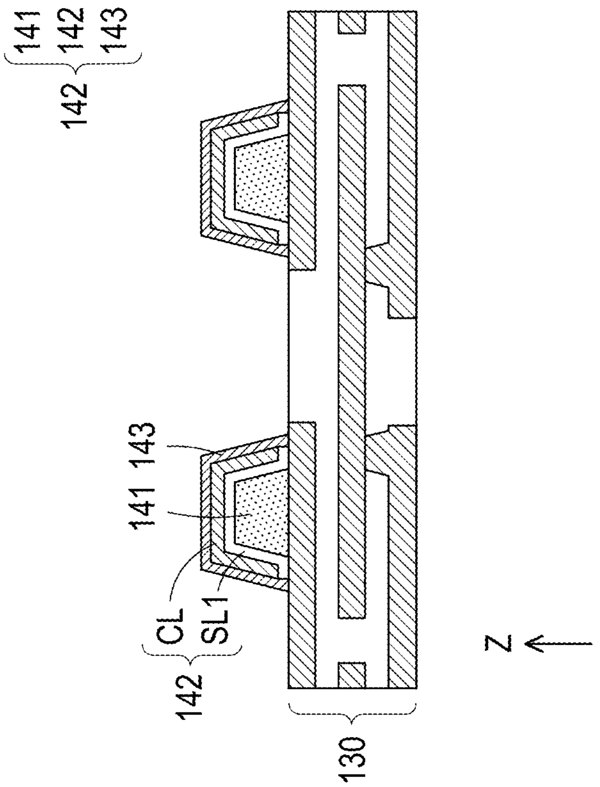
Figure 3E:
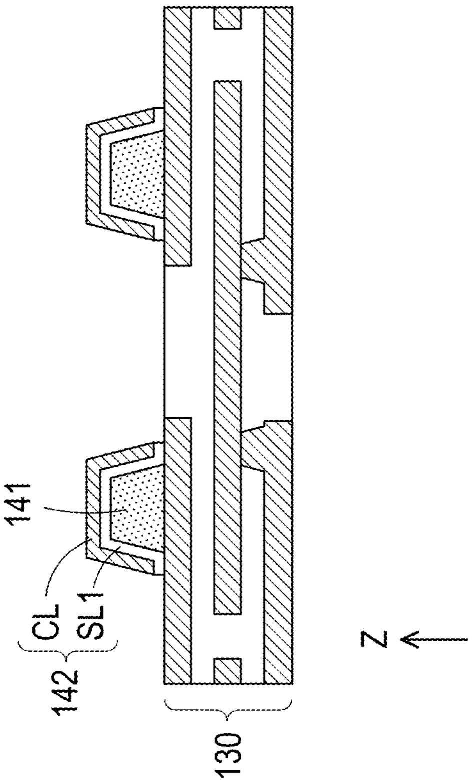

Next, referring to FIG. 3E, the second photoresist 310 is removed, and the seed layer SL not covered by the conductive material layer CL is removed. Specifically, after the second photoresist 310 is removed, the second portion SL2 of the seed layer SL is removed, for example, by etching, and the first portion SL1 of the seed layer SL covered by the conductive material layer CL is left. A combination of the conductive material layer CL and the first portion SL1 of the seed layer SL may be regarded as the conductive layer 142 of the contacting part 140.

Next, referring to FIG. 3F, the anti-oxidation layer 143 is formed on the conductive layer 142 by steps similar to those in FIG. 3D to FIG. 3E. At this point, the contacting part 140 of the electronic device 100 of this embodiment has been substantially manufactured.

In this embodiment, the elongation is measured by, for example, a standard test method (ASTM D638) for tensile properties of plastics. Specifically, a component to be subjected to a tensile test is first separated from the electronic device 100. Next, at the two pre-marked points on the component, where the distance between the two pre-marked points refers to a gage length. Next, the component is stretched by a stretching machine (for example, a universal testing machine), so that the gauge length is gradually extended during the stretching test, where elongation=(gauge length after breaking−original gauge length before breaking)÷original gauge length before breaking×100%. Alternatively, the elongation may be the elongation at yield (that is, the longest elongation before permanent deformation of the component occurs) calculated by the component according to the elongation ratio of the component at the yield.

In this embodiment, the electronic device 100 may be a testing device, such as a high-frequency testing device, but the disclosure is not limited thereto.

Other embodiments are listed below for illustration. Herein, it should be noted that the following embodiments use the reference numerals and part contents of the previous embodiments, where the same reference numerals are used to represent the same or similar elements, and the description of the same technical contents is omitted. The description of omitted parts may refer to the aforementioned embodiments, and is not repeated in the following embodiment.

Figure 4:
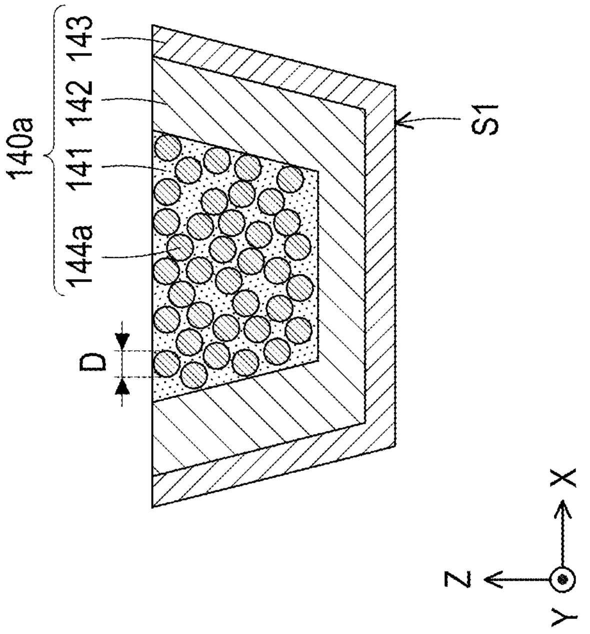
FIG. 4 is a schematic cross-sectional view of a contacting part of an electronic device according to a second embodiment of the disclosure.

FIG. 4 is a schematic cross-sectional view of a contacting part of an electronic device according to a second embodiment of the disclosure. Referring to FIG. 4 and FIG. 2B together, the contacting part 140*a* of the disclosure is similar to the contacting part 140 in FIG. 2B, but the difference between the two lies in that the contacting part 140*a* of this embodiment further includes a filler 144*a*.

Specifically, referring to FIG. 4, the filler 144*a* is dispersed in the insulating part 141, and a filling rate of the filler 144*a* of the insulating part 141 may be 40 wt % to 88 wt % (40 wt %≤filling rate≤88 wt %) to reduce the resistance of the insulating part 141, but the disclosure is not limited thereto. In this embodiment, a material of the filler 144*a* may include copper, gold, silver, tin, other materials having conductive properties, or a combination thereof, but the disclosure is not limited thereto. The term "dispersed" as used herein means that there is a pitch between two particles in the same medium or the two particles are not in contact with each other.

In this embodiment, the filler 144*a* has a particle size D. The particle size D of the filler 144*a* may be 0.1 μm to 50 μm (0.1 μm≤particle size≤50 μm), or 0.5 μm to 8 μm (0.5 μm≤particle size≤8 μm), but the disclosure is not limited thereto. By adding the filler 144*a*, the buffering capacity of the contacting part 140 may be adjusted to make the design more flexible, thereby increasing the service life of the circuit structure 130 or reducing the possibility of scratches on the object to be detected, but the disclosure is not limited thereto.

Figure 5:
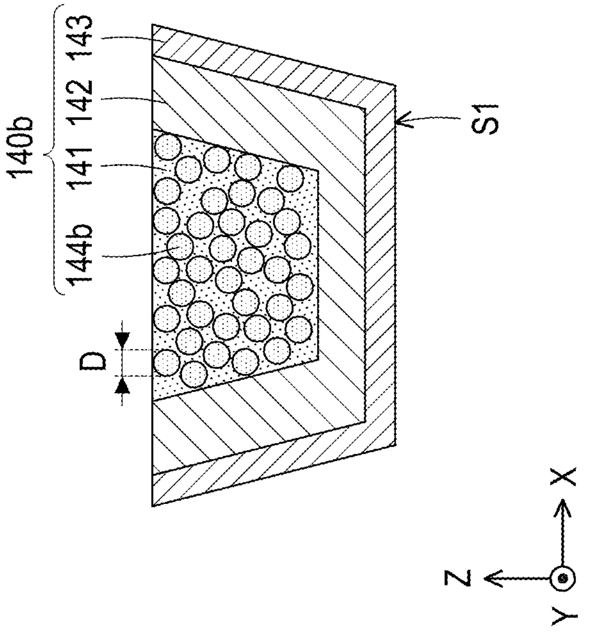
FIG. 5 is a schematic cross-sectional view of a contacting part of an electronic device according to a third embodiment of the disclosure.

FIG. 5 is a schematic cross-sectional view of a contacting part of an electronic device according to a third embodiment of the disclosure. Referring to FIG. 5 and FIG. 4 together, the contacting part 140*b* of this embodiment is similar to the contacting part 140*a* in FIG. 4, but the difference between the two lies in that in the contacting part 140*b* of this embodiment, a material of the filler 144*b* is an insulating material with a higher hardness than the insulating part 141 to increase the hardness of the insulating part 141. In this embodiment, the material of the filler 144*b* may include silicon oxide, silicon nitride, plastic, other high-hardness insulating materials, or a combination thereof, but the disclosure is not limited thereto.

Figure 6:
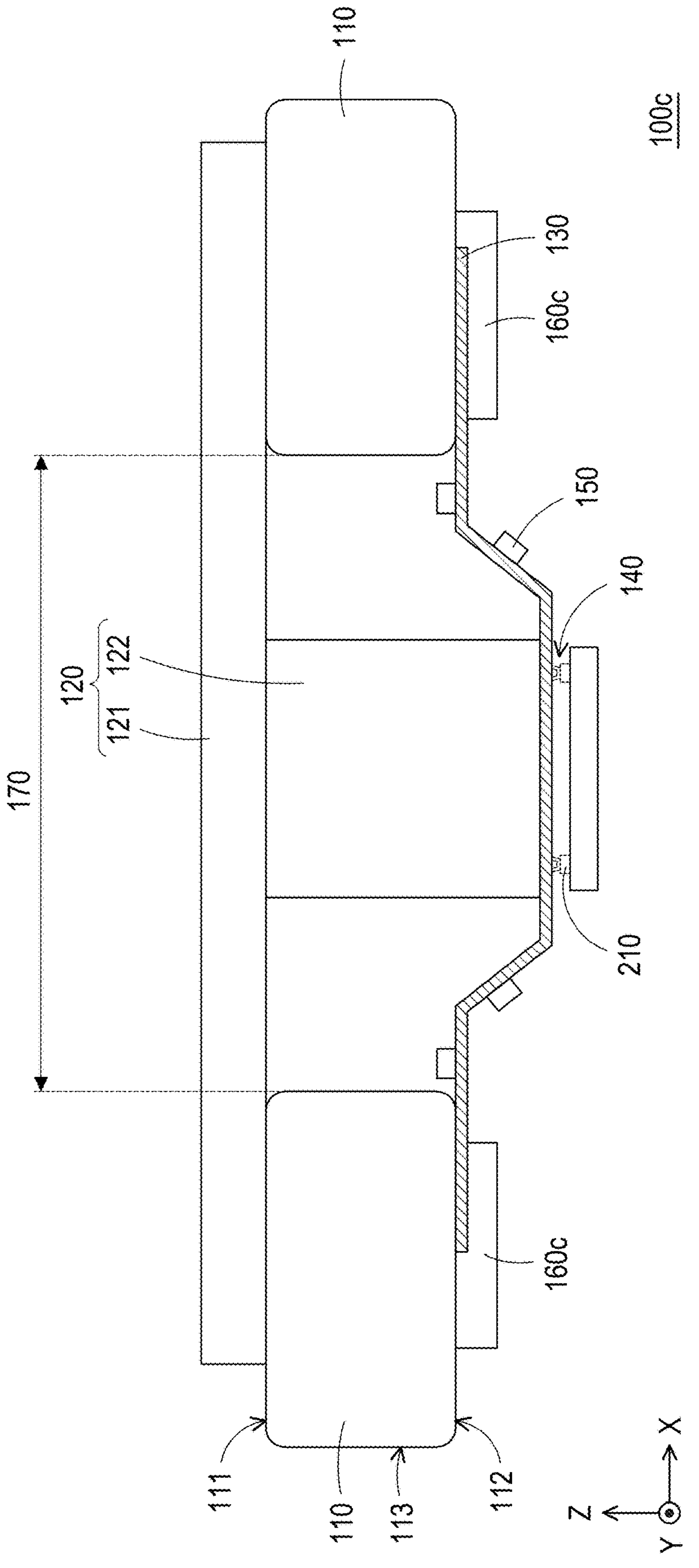
FIG. 6 is a schematic cross-sectional view of an electronic device according to a fourth embodiment of the disclosure.

FIG. 6 is a schematic cross-sectional view of an electronic device according to a fourth embodiment of the disclosure. Referring to FIG. 6 and FIG. 1 together, an electronic device 100*c* of this embodiment is similar to the electronic device 100 in FIG. 1, but the difference between the two lies in that the electronic device 100*c* of this embodiment further includes a connector 160*c*.

Specifically, referring to FIG. 6, the connector 160*c* is disposed on the lower surface 112 of the circuit board 110 to fix the circuit structure 130. In this embodiment, the connector 160*c* may be an independent component or a portion of the carrier board 120.

The circuit structure 130 is disposed between the lower surface 112 of the circuit board 110 and the connector 160*c*, and the circuit board 110 is disposed between the carrier board 120 and the circuit structure 130, thereby shortening a transmission path of the electrical signal between the circuit board 110 and the object to be detected 200 to reduce the loss of the electrical signal or improve the accuracy of the electrical test.

Figure 7:
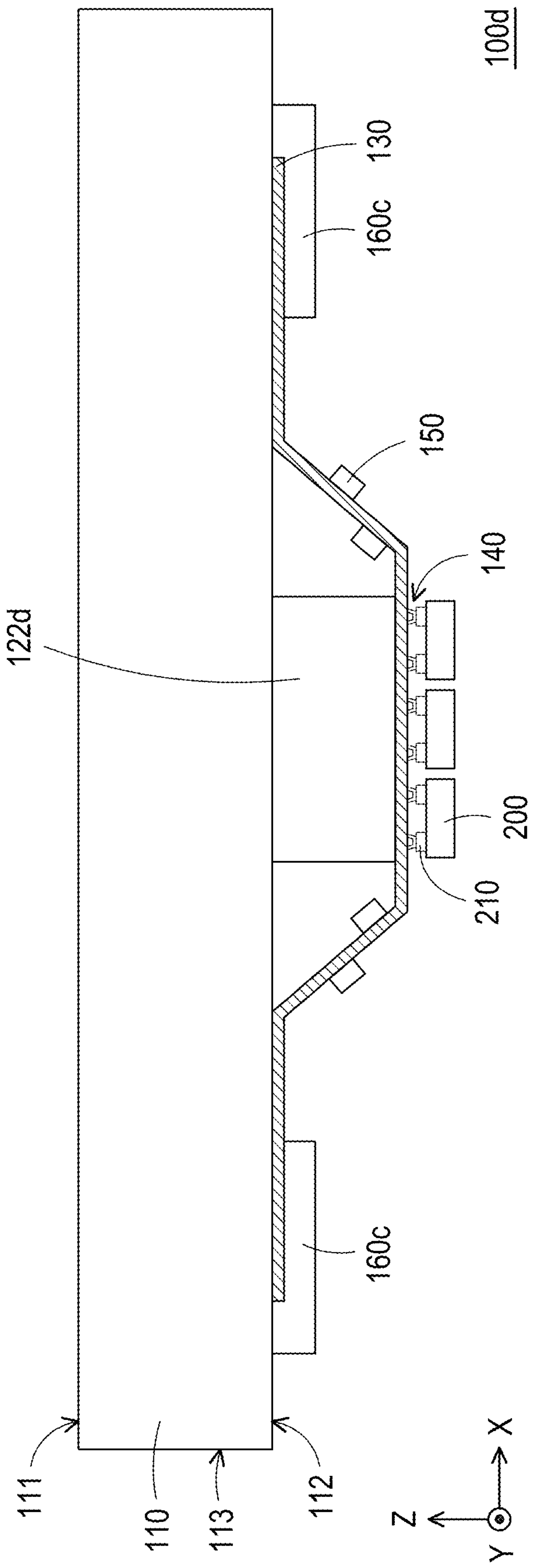
FIG. 7 is a schematic cross-sectional view of an electronic device according to a fifth embodiment of the disclosure.

FIG. 7 is a schematic cross-sectional view of an electronic device according to a fifth embodiment of the disclosure. Referring to FIG. 7 and FIG. 1 together, an electronic device 100*d* of this embodiment is similar to the electronic device 100*c* in FIG. 6, but the difference between the two lies in that the body 121 and the through groove 170 in FIG. 6 are omitted in the electronic device 100*d* of this embodiment.

Specifically, referring to FIG. 7, a buffer 122*d* is directly disposed on the lower surface 112 of the circuit board 110, so that the pressed circuit structure 130 may contact multiple objects to be tested 200 (FIG. 7 schematically shows three objects to be tested 200, but the disclosure is not limited thereto) by the contacting parts 140 at the same time, so as to detect the objects to be tested 200 at the same time and reduce the overall detecting time.

In addition, in this embodiment, the circuit board 110*d* without the through groove 170 may increase the utilization rate of the trace space.

To sum up, in the electronic device and the manufacturing method thereof according to the embodiments of the disclosure, since the contacting part contains an elastic or high-elongation insulating part (for example, an insulating part with an elongation of 20% to 900%, or an insulating part with an elongation greater than the insulating part of the insulating layer of the circuit structure), the toughness and deformation of the contacting part can be increased, and the contacting part can provide a buffering effect to reduce damage to the object to be detected or slow down the aging of the circuit structure. Since the length of the contacting part may be 5 μm to 200 μm and the width of the contacting part may be 5 μm to 200 μm, the bottom surface of the contacting part may have a sufficient contact area to contact the conductive pad of the object to be detected, thereby reducing the contact resistance. Since the height of the contacting part may be 30 μm to 200 μm and the ratio of the length to the height of the contacting part may be greater than or equal to ½, there may be sufficient buffering space to slow down the aging of the circuit structure when the contacting part collapses due to pressing down the conductive pad of the object to be detected. Since the insulating part of the contacting part contains a conductive filler and the filling rate of the filler of the insulating part may be 40 wt % to 88 wt %, the resistance of the insulating part can be reduced. Since the insulating part of the contacting part contains a filler with high hardness and the filling rate of the filler of the insulating part may be 40 wt % to 88 wt %, the hardness of the insulating part can be increased.

Finally, it should be noted that the aforementioned embodiments are only used to illustrate the technical solution of the disclosure, but not to limit thereto. Although the disclosure has been described in detail with reference to the aforementioned embodiments, a person skilled in the art should understand that the technical solutions described in the aforementioned embodiments may still be modified, or parts or all of the technical features thereof may be replaced by equivalents. However, these modifications or substitutions do not make the essence of the corresponding technical solutions deviate from the scope of the technical solutions of the embodiments of the disclosure.

What is claimed is:

1. An electronic device, comprising: a circuit structure; and at least one contacting part, disposed on the circuit structure and comprising an insulating part and a conductive layer; wherein the conductive layer surrounds the insulating part, and the conductive layer is electrically connected to the circuit structure; and wherein the at least one contacting part further comprises: a filler, dispersed in the insulating part.

2. The electronic device according to claim 1, wherein an elongation of the insulating part is 20% to 900%.

3. The electronic device according to claim 1, wherein a particle size of the filler is 0.1 μm to 50 μm.

4. The electronic device according to claim 1, wherein a filling rate of the filler is 40 wt % to 88 wt %.

5. The electronic device according to claim 1, wherein an elongation of the insulating part is greater than an elongation of an insulating layer of the circuit structure.

6. The electronic device according to claim 1, wherein the at least one contacting part further comprises: an anti-oxidation layer, surrounding the conductive layer, wherein a thickness of the anti-oxidation layer is less than a thickness of the conductive layer.

7. The electronic device according to claim 1, wherein a bottom surface of the at least one contacting part has a length and a width, the length is 5 μm to 200 μm, and the width is 5 μm.

8. The electronic device according to claim 7, wherein the at least one contacting part has a height, and the height is 30 μm to 200 μm.

9. The electronic device according to claim 8, wherein a ratio of the length to the height is greater than or equal to 0.5 and less than or equal to 1.5.

10. A manufacturing method of an electronic device, comprising: providing a circuit structure; and forming at least one contacting part on the circuit structure, wherein the at least one contacting part comprises an insulating part and a conductive layer, the conductive layer surrounds the insulating part, and the conductive layer is electrically connected to the circuit structure; and wherein the at least one contacting part further comprises a filler, and the filler is dispersed in the insulating part.

11. The manufacturing method of the electronic device according to claim 10, wherein the step of forming the at least one contacting part on the circuit structure comprises: forming a first photoresist on the circuit structure, wherein the first photoresist has a first opening; forming the insulating part in the first opening; removing the first photoresist and forming a seed layer on the insulating part; forming a second photoresist on the seed layer, wherein the second photoresist has a second opening; forming a conductive material layer in the second opening; and removing the second photoresist and removing the seed layer not covered by the conductive material layer, wherein a combination of the conductive material layer and the seed layer covered by the conductive material layer is regarded as the conductive layer.

12. The manufacturing method of the electronic device according to claim 11, further comprising: forming an anti-oxidation layer on the conductive layer.

13. The manufacturing method of the electronic device according to claim 12, further comprising: providing a circuit board, so that the circuit board is electrically connected to the circuit structure and the at least one contacting part.

14. The manufacturing method of the electronic device according to claim 13, further comprising: providing a carrier board, so that at least portion of the circuit structure is disposed between the carrier board and the circuit board.

15. The manufacturing method of the electronic device according to claim 14, further comprising: providing a through groove, wherein the through groove is disposed between two adjacent circuit boards.

16. The manufacturing method of the electronic device according to claim 15, wherein the carrier board comprises: a body, disposed on the circuit board; and a buffer, disposed in the through groove.

17. The manufacturing method of the electronic device according to claim 16, wherein an elongation of the insulating part is greater than an elongation of an insulating layer of the circuit structure.

18. A manufacturing method of an electronic device, wherein the manufacturing method has a first operation mode and comprises: forming at least one contacting part on the circuit structure; and providing an object to be detected, so that the at least one contacting part is electrically connected to the object to be detected in the first operation mode, wherein the at least one contacting part comprises an insulating part and a conductive layer, the conductive layer surrounds the insulating part, and the conductive layer is electrically connected to the circuit structure; and wherein the at least one contacting part further comprises a filler, and the filler is dispersed in the insulating part.

* * * * *